(12) United States Patent
Cheng et al.

(10) Patent No.: US 8,629,506 B2
(45) Date of Patent: Jan. 14, 2014

(54) REPLACEMENT GATE CMOS

(75) Inventors: Kangguo Cheng, Guilderland, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 789 days.

(21) Appl. No.: 12/407,011

(22) Filed: Mar. 19, 2009

(65) Prior Publication Data

US 2010/0237424 A1 Sep. 23, 2010

(51) Int. Cl.
*H01L 21/70* (2006.01)

(52) U.S. Cl.
USPC ............... 257/369; 257/371; 257/E29.345

(58) Field of Classification Search
USPC ............ 257/369, 371, E29.345, E29.632, 69, 257/274, 338, 350, 351, 357, 511, 512, 525, 257/555, 569, 574, E21.362, E27.046, 257/E27.064, E27.108, E21.632, E27.057, 257/E27.062, E21.611, E21.612; 438/199, 438/207, 218, 219, 223, 224, 227, 228
See application file for complete search history.

(56) References Cited

U.S. PATENT DOCUMENTS

| | | | |
|---|---|---|---|
| 6,355,556 B1 * | 3/2002 | Tseng ............................ | 438/638 |
| 6,787,469 B2 | 9/2004 | Houston et al. | |
| 7,820,513 B2 * | 10/2010 | Hareland et al. ............... | 438/283 |
| 7,842,594 B2 * | 11/2010 | Cho et al. ....................... | 438/589 |
| 2004/0173825 A1 | 9/2004 | Lyu et al. | |
| 2005/0186747 A1 * | 8/2005 | Amos et al. ..................... | 438/301 |
| 2006/0097316 A1 * | 5/2006 | Chen et al. ....................... | 257/347 |
| 2006/0118879 A1 * | 6/2006 | Li .................................. | 257/369 |
| 2006/0138553 A1 * | 6/2006 | Brask et al. ..................... | 257/369 |
| 2006/0163665 A1 * | 7/2006 | Chuang et al. ................. | 257/374 |
| 2007/0284671 A1 * | 12/2007 | Tsutsumi et al. .............. | 257/369 |
| 2008/0135987 A1 | 6/2008 | Li et al. | |

FOREIGN PATENT DOCUMENTS

WO WO2009032230 3/2009

OTHER PUBLICATIONS

International Search Report and Written Opinion PCT/EP2010/053064 dated Apr. 6, 2010.

* cited by examiner

*Primary Examiner* — Cuong Q Nguyen
*Assistant Examiner* — Yosef Gebreyesus
(74) *Attorney, Agent, or Firm* — Scully, Scott, Murphy & Presser, P.C.; H. Daniel Schnurmann

(57) ABSTRACT

A CMOS structure and a method for fabricating the CMOS structure include within a semiconductor substrate a first gate located over a first active region of a first polarity and a second gate located over a second active region of a second polarity different than the first polarity. The first active region and the second active region are separated by an isolation region. The first gate and the second gate are co-linear, with facing endwalls that terminate over the isolation region. The facing endwalls do not have a spacer located or formed adjacent or adjoining thereto, although sidewalls of the first gate and the second gate do. The CMOS structure may be fabricated using a sequential replacement gate method.

12 Claims, 9 Drawing Sheets

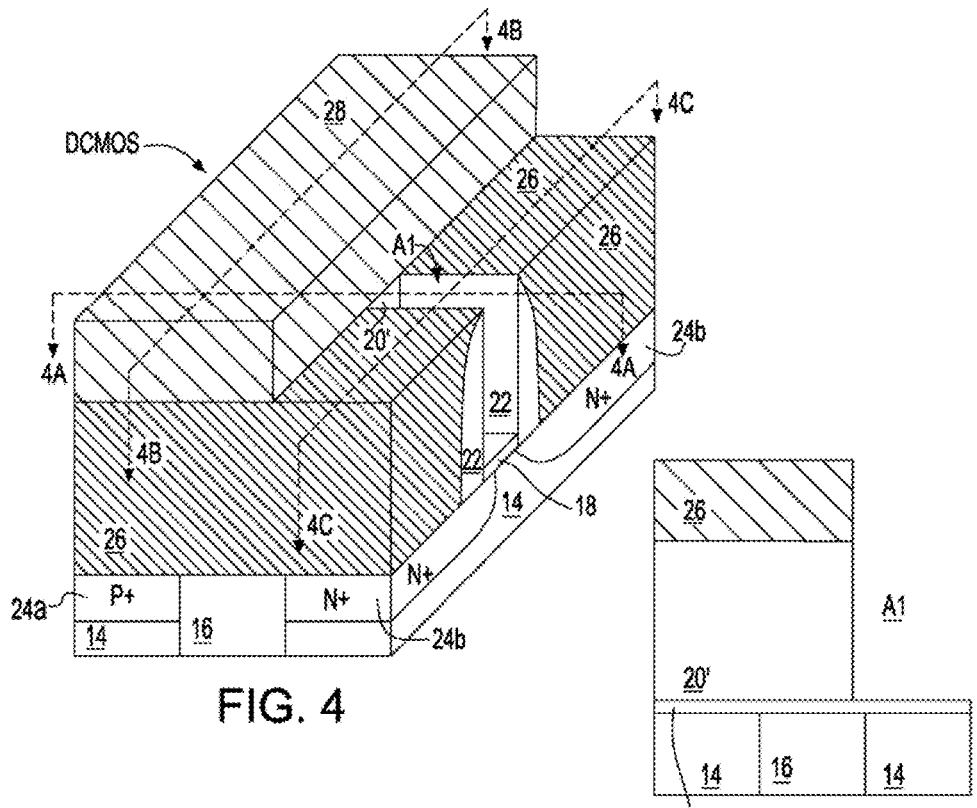
FIG. 4
FIG. 4A
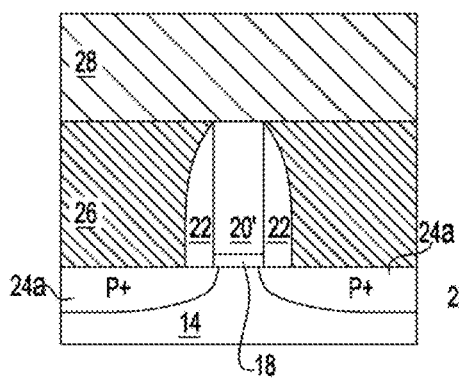
FIG. 4B
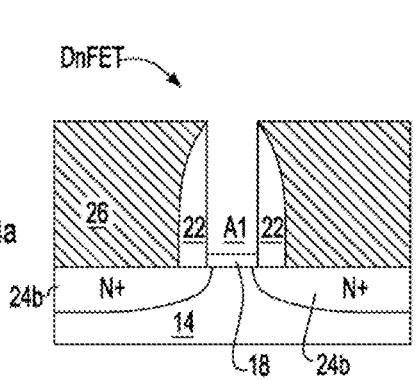
FIG. 4C

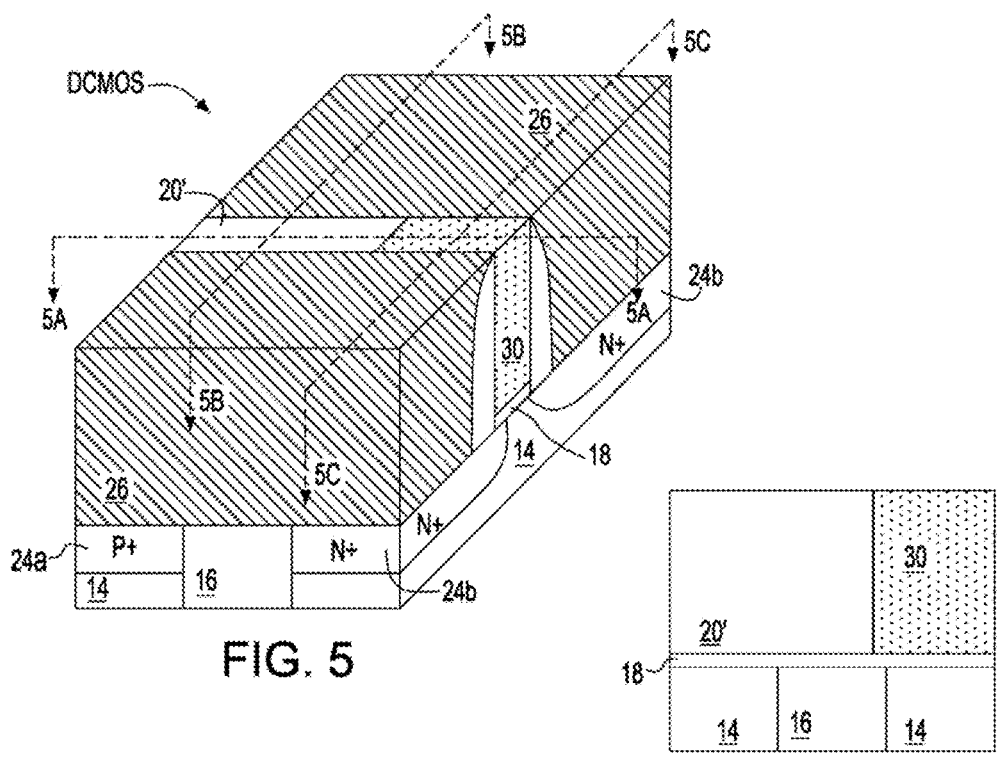
FIG. 5
FIG. 5A
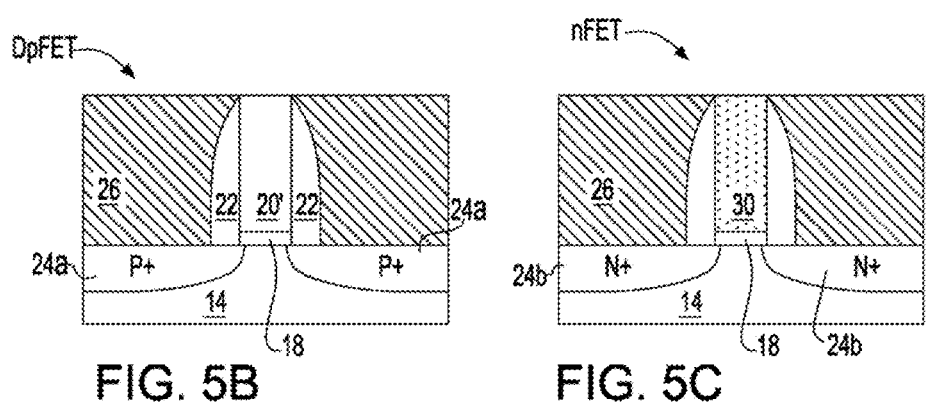
FIG. 5B
FIG. 5C

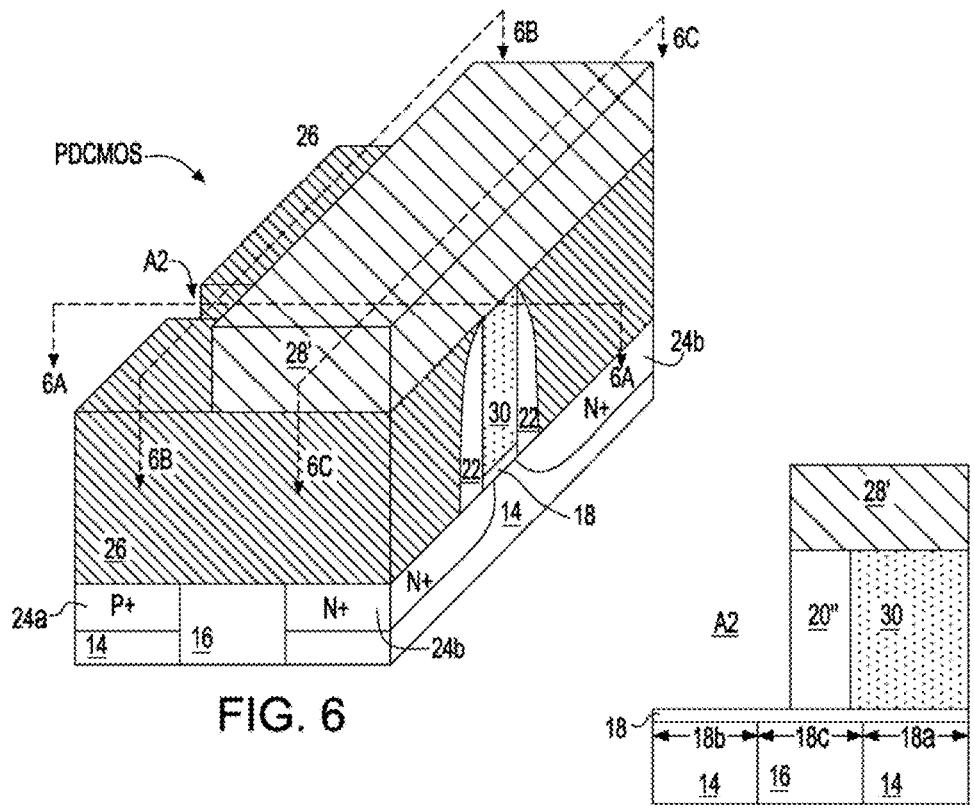
FIG. 6
FIG. 6A
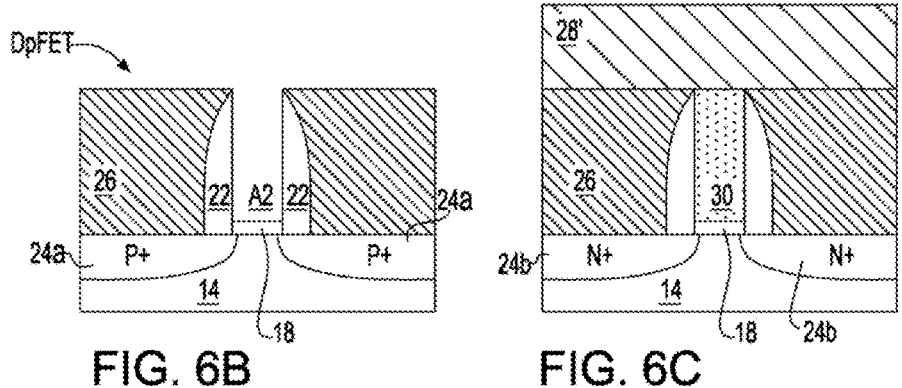
FIG. 6B
FIG. 6C

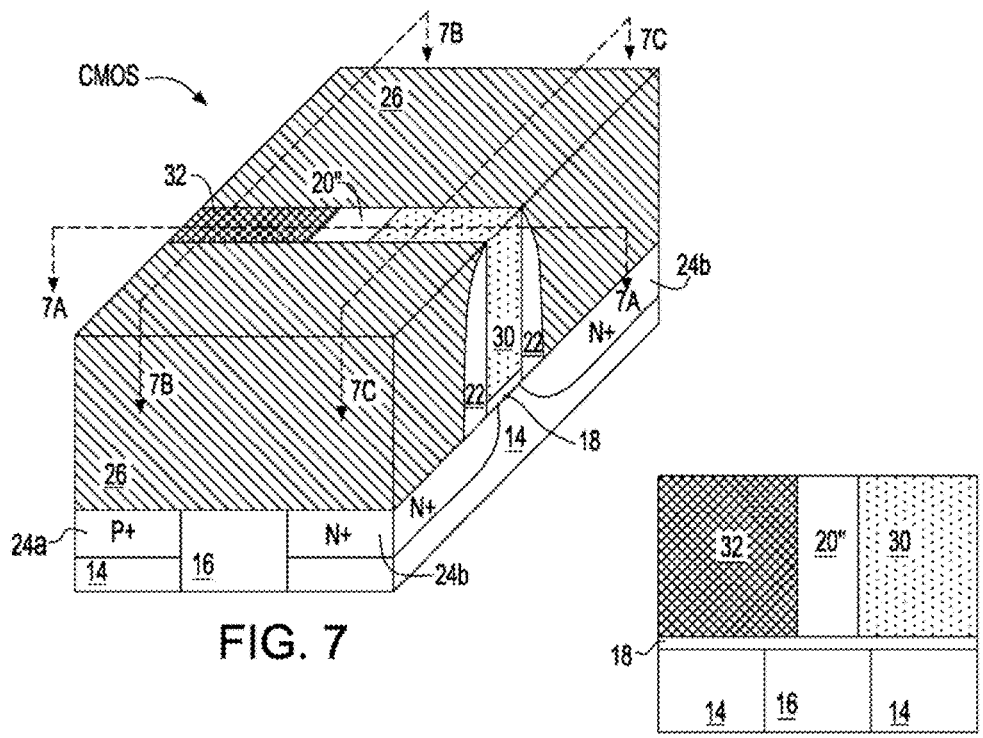
FIG. 7
FIG. 7A
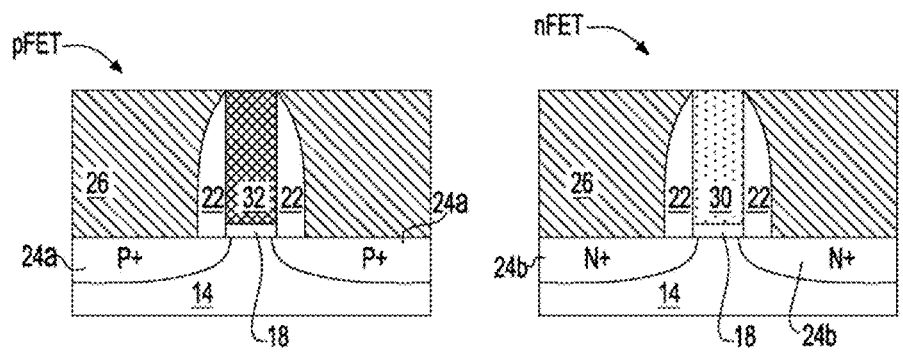
FIG. 7B
FIG. 7C

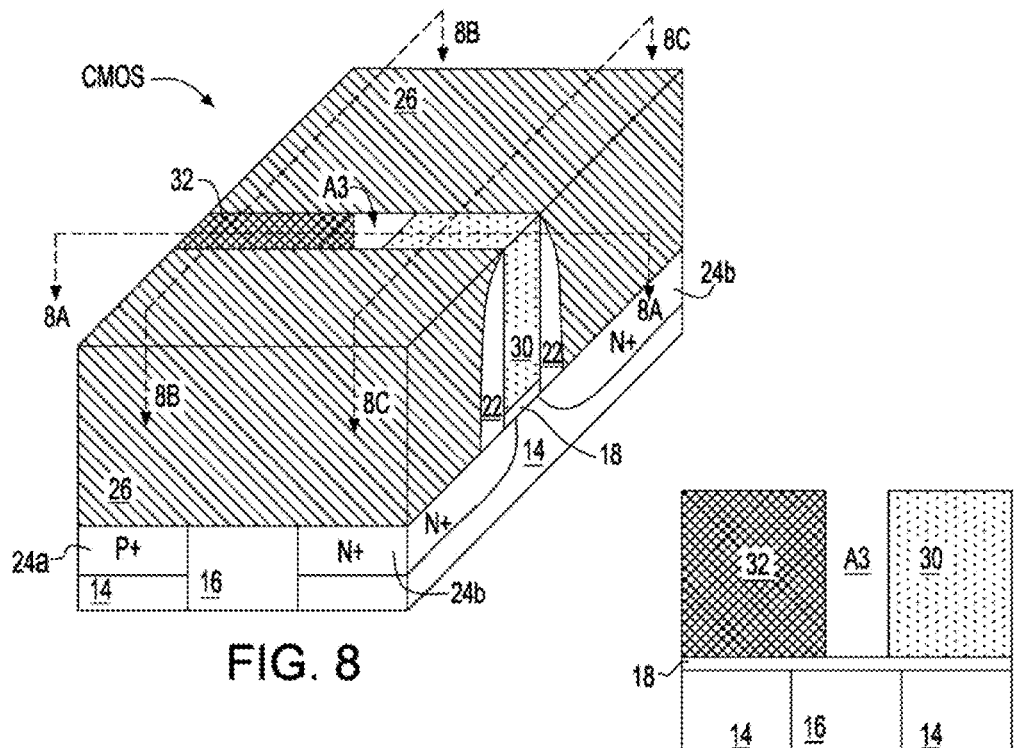
FIG. 8
FIG. 8A
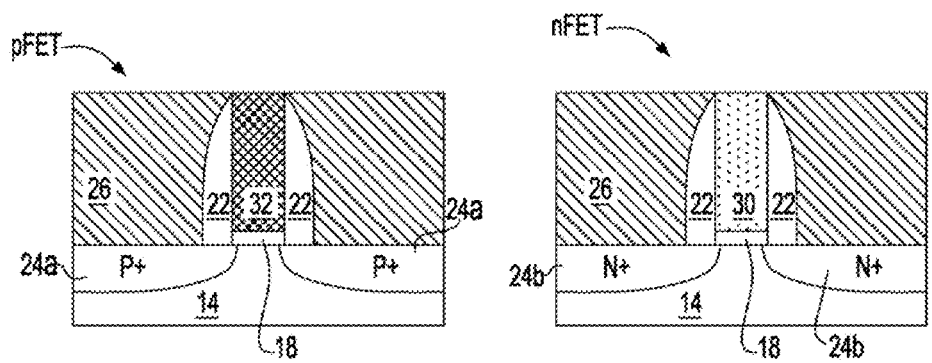
FIG. 8B
FIG. 8C

REPLACEMENT GATE CMOS

BACKGROUND

1. Field of the Invention

The invention relates generally to complementary metal oxide semiconductor (CMOS) structures, and methods for fabricating CMOS structures. More particularly, the invention relates to CMOS structures with enhanced performance, and methods for fabricating those CMOS structures.

2. Description of the Related Art

In addition to stand alone transistors (i.e., including field effect transistors (FETs), as well as bipolar transistors), resistors, diodes and capacitors, semiconductor structures also often include CMOS structures. A CMOS structure includes a complementary doped pair of field effect transistor devices including a pFET device and an nFET device. CMOS structures and CMOS devices are desirable within the semiconductor fabrication art insofar as semiconductor circuit configurations that are based upon CMOS structures and CMOS devices provide for reduced power consumption in comparison with alternative semiconductor circuit configurations that are not based upon CMOS structures and CMOS devices.

In addition, CMOS structures and CMOS devices have been successfully scaled in dimension for several decades to provide for continued enhancements in semiconductor circuit performance and semiconductor circuit functionality.

While CMOS structures and CMOS devices are quite common in the semiconductor fabrication art, similarly with other semiconductor structures and semiconductor devices they are not entirely without limitations.

In that regard, as CMOS structure and CMOS device dimensions continue in a scaled decrease, lithographic limitations for uniformly fabricating individual pFET and nFET components (i.e., such as but not limited to gates) with desirable resolution and dimensional control within a particular CMOS structure becomes increasingly more challenging.

SUMMARY

The invention provides a CMOS structure and a method for fabricating the CMOS structure. The CMOS structure includes a first gate located over a first active region of a first polarity within a semiconductor substrate and a second gate located over a second active region of a second polarity different than the first polarity within the semiconductor substrate. The first gate and the second gate are co-linear, and facing endwalls of the first gate and the second gate (i.e., that are separated by a gap) terminate over an isolation region that separates the first active region and the second active region. The facing endwalls of the first gate and the second gate do not have a spacer located and formed adjacent or adjoining thereto. In comparison, nominally parallel and co-linear sidewalls of the first gate and the second gate do have a spacer located adjacent or adjoining thereto. In addition, separating the facing endwalls of the first gate and the second gate over the isolation region is a vertical portion of a multi-planar "T" shaped dielectric layer.

Within the context of the invention as disclosed and claimed, a "multi-planar 'T' shaped" dielectric layer is intended as comprising a "T" shape with respect to any of several vertical planes that pass through the vertical portion of the "T."

The CMOS structure in accordance with the invention may be fabricated using a sequential replacement gate methodology that provides the gap between the first gate and the second gate. This particular gap is filled with the vertical portion of the multi-planar T shaped dielectric layer. The particular methodology in accordance with the invention provides that the first gate and the second gate may be fabricated with superior dimensional control by using the replacement gate methodology, rather than a lithographic and etch methodology.

A particular CMOS structure in accordance with the invention includes a first FET having a first polarity and including a first gate located upon a first gate dielectric located upon a first active region of a semiconductor substrate. This particular CMOS structure also includes a second FET having a second polarity different than the first polarity and including a second gate located upon a second gate dielectric located upon a second active region of the semiconductor substrate separated from the first active region of the semiconductor substrate by an isolation region. The first gate and the second gate are co-linear. An endwall of the first gate and an endwall of the second gate terminate facing each other over the isolation region absent a spacer located adjacent or adjoining the facing endwall of the first gate or the facing endwall of the second gate, but including a spacer adjacent or adjoining a sidewall of the first gate and a sidewall of the second gate.

Another particular CMOS structure in accordance with the invention includes a first FET having a first polarity and including a first gate located upon a first gate dielectric located upon a first active region of a semiconductor substrate. This other particular CMOS structure also includes a second FET having a second polarity different than the first polarity and including a second gate located upon a second gate dielectric located upon a second active region of the semiconductor substrate separated from the first active region of the semiconductor substrate by an isolation region. The first gate and the second gate are co-linear. An endwall of the first gate and an endwall of the second gate terminate facing each other over the isolation region and are separated by a gap, absent a spacer adjacent or adjoining the facing endwall of the first gate or the facing endwall of the second gate, but including a spacer adjacent or adjoining a sidewall of the first gate and a sidewall of the second gate. This other particular CMOS structure also includes a multi-planar T shaped passivation layer passivating the first FET and the second FET, and filling the gap.

A particular method for fabricating a CMOS structure in accordance with the invention includes forming over a semiconductor substrate that includes a first active region of a first polarity separated from a second active region of a second polarity different polarity than the first polarity by an isolation region a dummy CMOS structure that includes a dummy gate that traverses the first active region, the isolation region and the second active region. This particular method also includes removing a first portion of the dummy gate over the first active region and an adjoining portion of the isolation region to provide a first aperture, and backfilling the first aperture with a first gate. This particular method also includes removing a second portion of the dummy gate over the second active region and an adjoining portion of the isolation region to provide a second aperture, and backfilling the second aperture with a second gate that is separated from the first gate by a third remainder portion of the dummy gate. This particular method also includes removing the third remainder portion of the dummy gate to provide a third aperture bounded by facing endwalls of the first gate and the second gate. This particular method also includes filling the third aperture with a passivation layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein:

FIGS. 4/4A/4B/4C show the results of a partial dummy gate removal process step within the context of the dummy CMOS structure of FIG. 3.

FIGS. 5/5A/5B/5C show the results of a partial gate replacement process step within the context of the dummy CMOS structure of FIGS. 4/4A/4B/4C.

FIGS. 6/6A/6B/6C show the results of a further partial dummy gate removal process step within the context of the partial dummy CMOS structure of FIGS. 5/5A/5B/5C.

FIGS. 7/7A/7B/7C show the results of a further partial gate replacement process step within the context of the partial dummy CMOS structure of FIGS. 6/6A/6B/6C.

FIGS. 8/8A/8B/8C show the results of a final dummy gate removal process step within the context of the CMOS structure of FIGS. 7/7A/7B/7C.

DESCRIPTION OF THE PREFERRED EMBODIMENT

The invention, which includes a CMOS structure and a method for fabricating the CMOS structure, is understood within the context of the Description of the Preferred Embodiment, as set forth below. The Description of the Preferred Embodiment is understood within the context of the drawings described above. Since the drawings are intended for illustrative proposes, the drawings are not necessarily drawn to scale.

Figure 1:
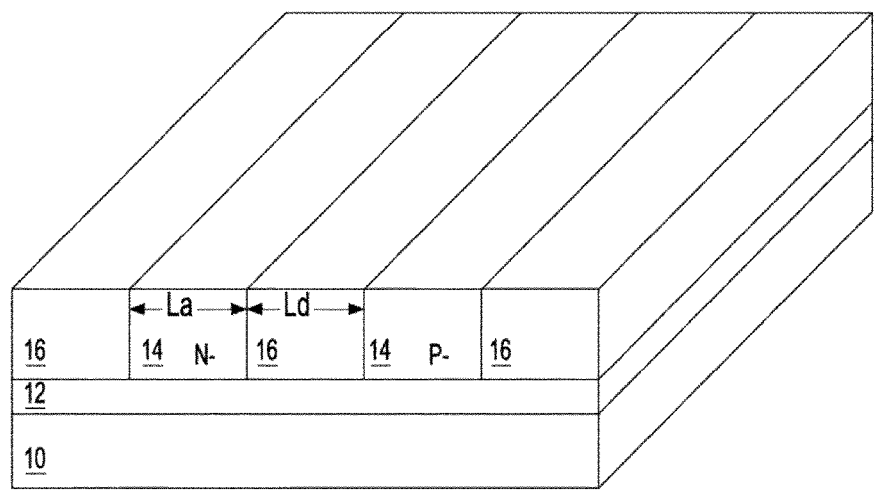
FIG. 1 shows a schematic perspective-view diagram of a surface semiconductor layer isolated semiconductor-on-insulator structure that may be used for fabricating a CMOS structure in accordance with a particular embodiment of the invention.

FIG. 1 to FIGS. 9/9A/9B/9C show a series of schematic perspective-view diagrams and schematic cross-sectional view diagrams illustrating the results of progressive process stages in fabricating a CMOS structure in accordance with a particular embodiment of the invention. This particular embodiment of the invention comprises a sole preferred embodiment of the invention. FIG. 1 shows a schematic cross-sectional diagram of the CMOS structure at an early stage in the fabrication thereof in accordance with this particular sole embodiment of the invention.

FIG. 1 shows a semiconductor substrate 10. A buried dielectric layer 12 is located and formed upon the semiconductor substrate 10. A plurality of surface semiconductor layers 14 is located and formed upon the buried dielectric layer 12 and separated by a plurality of isolation regions 16 that is also located and formed upon the buried dielectric layer 12. In an aggregate, the semiconductor substrate 10, the buried dielectric layer 12 and the surface semiconductor layers 14 (i.e., or more particularly a single surface semiconductor layer from which the surface semiconductor layers 14 are patterned) comprise a semiconductor-on-insulator substrate.

The base semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 comprises a silicon or silicon-germanium alloy semiconductor material that has a thickness from 30 to 1000 micrometers.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectric materials being preferred under some circumstances. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the base semiconductor substrate 10. Typically, the buried dielectric layer 12 has a thickness from 10 to 200 nanometers.

The surface semiconductor layers 14 may comprise any of the several semiconductor materials from which the base semiconductor substrate 10 may be comprised. The surface semiconductor layers 14 and the base semiconductor substrate 10 may comprise either identical or different semiconductor materials with respect to chemical composition, dopant concentration and crystallographic orientation. Typically, the surface semiconductor layers 14 have a thickness from 3 to 100 nanometers.

The semiconductor-on-insulator substrate portion of the CMOS structure that is illustrated in FIG. 1 may be fabricated using any of several methods. Non-limiting examples include lamination methods, layer transfer methods, and separation by implantation of oxygen (SIMOX) methods. After fabricating such a semiconductor-on-insulator substrate, the surface semiconductor layer may then be patterned to form the surface semiconductor layers 14, which as illustrated in FIG. 1 are separated by isolation trenches that reach the buried dielectric layer 12. The isolation regions 16 may then be formed into the isolation trenches while using a blanket isolation dielectric layer deposition and planarization process step.

Although this particular sole embodiment illustrates the early stages in fabricating a CMOS structure in accordance with the invention within the context of a semiconductor-on-insulator substrate comprising the base semiconductor substrate 10, the buried dielectric layer 12 located and formed upon the base semiconductor substrate 10 and the surface semiconductor layers 14 located and formed upon the buried dielectric layer 12, neither this particular sole embodiment, nor the invention, is so limited. Rather, the instant embodiment and the present invention may alternatively be practiced using a bulk semiconductor substrate (that would otherwise result from absence of the buried dielectric layer 12 under circumstances where the base semiconductor substrate 10 and the surface semiconductor layers 14 have identical chemical composition and crystallographic orientation). The embodiment and the invention also contemplate use of a hybrid orientation (HOT) substrate that has multiple semiconductor crystallographic orientations regions supported upon a single semiconductor substrate.

As suggested above, the isolation regions 16 that are illustrated as interposed between the surface semiconductor layers 14 within FIG. 1 comprise a dielectric isolation material. Such a dielectric isolation material may comprise a dielectric material, and be formed using methods, analogous, equivalent or identical to the dielectric material and methods that are used for forming the buried dielectric layer 12. Typically, each of the surface semiconductors layers 14 serves as an individual active region within a CMOS structure and has a linewidth La from 20 to 200 nanometers, while each of the isolation regions 16 has a linewidth Ld from 20 to 200 nanometers, as is illustrated in FIG. 1.

For clarity and brevity in further illustration of this particular embodiment, the base semiconductor substrate 10, the buried dielectric layer 12 and the outermost two isolation regions 16 will be omitted from further illustration in the remainder of this description.

Figure 2:
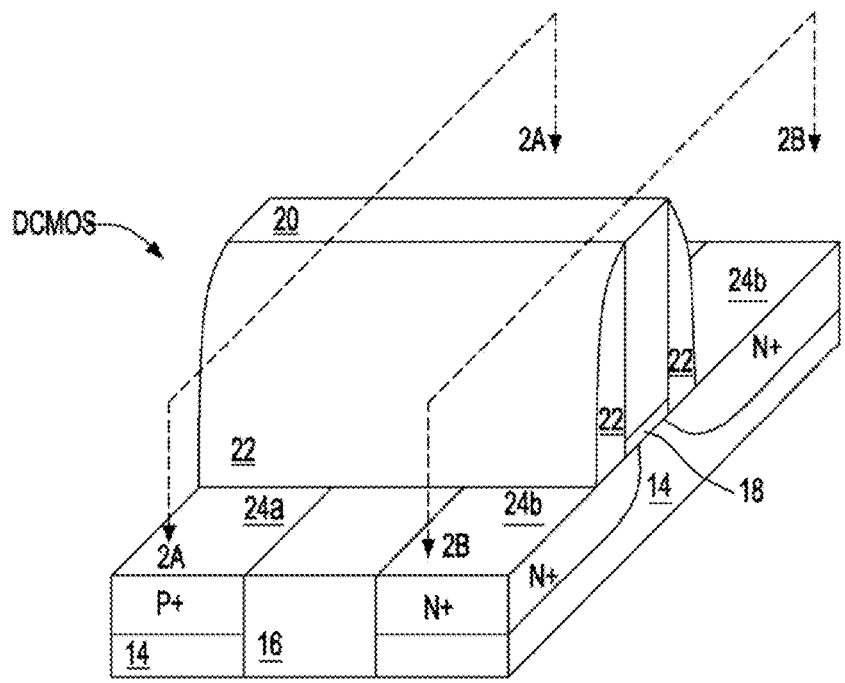
FIGS. 2/2A/2B shows a schematic perspective-view diagram and schematic cross-sectional view diagrams of a dummy CMOS structure fabricated within the surface semiconductor layer isolated semiconductor-on-insulator structure whose schematic perspective-view diagram is illustrated in FIG. 1.
Figure 2A:
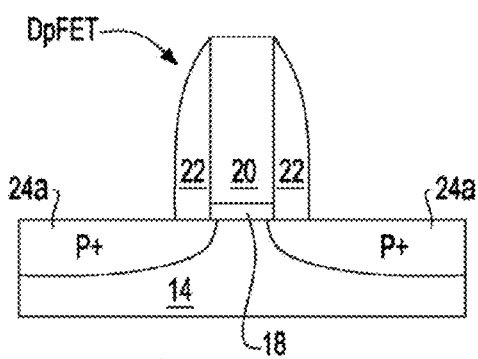
Figure 2B:
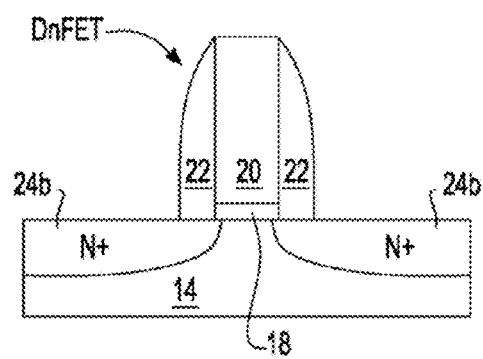

FIGS. 2/2A/2B show the results of forming a dummy pFET (DpFET) and a dummy nFET (DnFET) within a dummy CMOS (DCMOS) structure within the semiconductor-on-insulator structure whose schematic perspective-view diagram is illustrated in FIG. 1.

FIG. 2 in particular shows the dummy CMOS structure that includes a single dummy gate 20 that spans the two surface semiconductor layers 14 and the intervening isolation region 16 that separates the two surface semiconductor layers 14. Within the dummy CMOS structure, each of the dummy pFET and the dummy nFET comprises: (1) a gate dielectric 18 located and formed upon a particular surface semiconductor layer 14 (and possibly also upon the isolation region 16); (2) the dummy gate 20 located and formed upon the gate dielectrics 18; (3) a spacer 22 (illustrated as plural layers in perspective-view and cross-section, but intended as fully encircling the dummy gate 20 in a full plan-view) located and formed adjoining a pair of opposite sidewalls of the gate dielectrics 18 and the dummy gate 20; and (4) a plurality of source and drain regions 24a (for pFET) or 24b (for nFET) located and formed within the pertinent surface semiconductor layer 14 at locations not covered by the dummy gate 20. The individual source and drain regions 24a or 24b are separated by corresponding channel regions that are aligned beneath the dummy gate 20.

Each of the foregoing layers and structures that comprise the dummy CMOS structure whose schematic perspective-view diagram and cross-sectional view diagrams is illustrated in FIGS. 2/2A/2B may comprise materials and have dimensions that are otherwise generally conventional in the semiconductor fabrication art. Each of the foregoing layers and structures that comprise the dummy CMOS structure whose schematic perspective-view diagram and cross-sectional view diagrams is illustrated in FIGS. 2/2A/2B may also be formed using methods that are conventional in the semiconductor fabrication art.

The gate dielectrics 18 may comprise generally conventional dielectric materials such as oxides, nitrides and oxynitrides of silicon that have a dielectric constant from 4.0 up to 20, measured in vacuum. Alternatively, the gate dielectrics 18 may comprise generally higher dielectric constant dielectric materials having a dielectric constant greater than 20 to at least 100. Such higher dielectric constant dielectric materials may include, but are not limited to, hafnium oxides, hafnium silicates, titanium oxides, barium-strontium-titantates (BSTs) and lead-zirconate-titanates (PZTs). The embodiment and the invention also contemplate any combination, aggregate or laminate of foregoing dielectric materials. The gate dielectrics 18 may be formed using any of several methods that are appropriate to the material of composition of the gate dielectrics 18. Included, but not limiting are thermal or plasma oxidation or nitridation methods, atomic layer deposition, chemical vapor deposition methods and physical vapor deposition methods. Typically, the gate dielectrics 18 comprise at least in-part a generally higher dielectric constant dielectric material, such as a hafnium oxide based dielectric material that has a thickness from 1 to 10 nanometers. The gate dielectrics 18 may further comprise an interfacial layer such as silicon oxide, silicon oxynitride, and/or silicon nitride located under and adjoining a higher dielectric constant dielectric material. Such an interfacial layer, if present, typically has a thickness from 0.4 to 2 nanometers. Given appropriate additional processing within the context of further processing described below, this particular embodiment also contemplates that the gate dielectrics 18 may also comprise different dielectric materials for the dummy pFET and the dummy nFET.

The dummy gate 20 may comprise generally conventional gate conductor materials including but not limited to certain metals, metal alloys, metal nitrides and metal silicides, as well as laminates thereof and composites thereof. The dummy gate 20 may also comprise polysilicon and/or polysilicon-germanium alloy materials. The polysilicon and/or polysilicon-germanium alloy materials may or may not be doped by dopants such as boron, phosphorus, and/or arsenic with a dopant concentration from about 1e18 to about 1e22 dopant atoms per cubic centimeter. The dummy gate 20 may further comprise polycide materials (doped or undoped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, and for manufacturing convenience within the replacement gate process that follows, the dummy gate 20 comprises a doped or undoped polysilicon material that has a thickness from about 15 to 100 nanometers.

The spacer 22 may comprise spacer materials including, but not limited to conductor spacer materials and dielectric spacer materials. Conductor spacer materials are less common but are nonetheless known. Dielectric spacer materials are more common. The spacer materials may be formed using methods analogous, equivalent or identical to the methods that are used for forming other conductor materials and dielectric materials that are discussed above. Chemical vapor deposition methods and physical vapor deposition methods are most common, but by no means limit the embodiment. The spacer 22 is also formed with the distinctive inward pointing spacer shape by using a blanket layer deposition and anisotropic etchback method. Typically, the spacer 22 comprises a single layer, or alternatively multiple layers, of dielectric materials such as a silicon oxide dielectric material, a silicon nitride dielectric material or a related dielectric material, although the embodiment is also not so limited.

The source and drain regions 24a or 24b comprises a generally conventional p-type dopant (e.g., boron, indium) for the dummy pFET or a generally conventional n-type dopant (e.g., phosphorus, arsenic) for the dummy nFET. As is understood by a person skilled in the art, either of source and drain regions 24a or 24b is formed using a two-step ion implantation method. A first ion implantation process step within the method uses the dummy gate 20, absent the spacer 22, as a mask to form extension regions which extend beneath the spacer 22. A second ion implantation process step uses the dummy gate 20 and the spacer 22 as a mask to form a larger contact region portion of the source and drain regions 24a and 24b, while simultaneously incorporating the extension regions. P-type or n-type dopant concentrations are from 1e19 to 1e21 dopant atoms per cubic centimeter within the source and drain regions 24a or 24b. Extension regions within source and drain regions 24a or 24b may under certain circumstances be more lightly doped than contact regions with the source and drain regions 24a or 24b, although such differential doping concentrations are not a requirement of the embodiment or of the invention.

Figure 3:
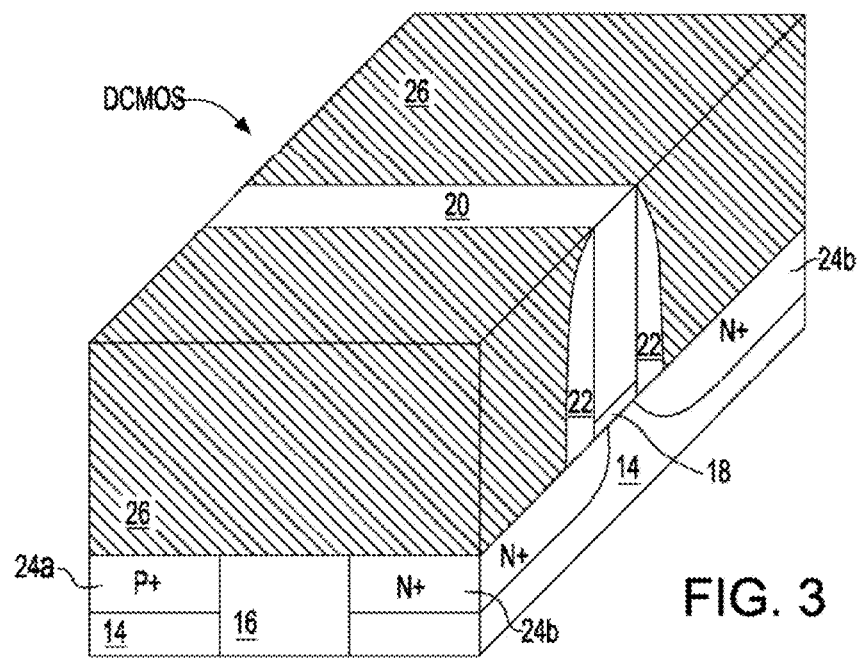
FIG. 3 shows the results of fabricating a planarizing layer upon the dummy CMOS structure of FIGS. 2/2A/2B.

FIG. 3 shows a first passivation layer 26 (i.e., a planarizing passivation layer) located and formed planarizing the dummy CMOS structure of FIG. 2 while using the dummy gate 20 as a stop layer, which may typically further serve as a planarizing stop layer.

The first passivation layer 26 may comprise any of several dielectric passivation materials. Suitable dielectric passivation materials may include generally higher dielectric constant dielectric materials, such as but not limited to silicon oxide, silicon nitride or silicon oxynitride dielectric materials that have a dielectric constant from 4.0 up to 20, measured in vacuum. Alternatively, the first passivation layer 26 may comprise generally lower dielectric constant dielectric materials that have a dielectric constant from 2.5 up to 4.0. Suitable examples of these generally lower dielectric constant dielectric materials include spin-on-glass dielectric materials, spin-on-polymer dielectric materials, nanoporous dielectric materials, microporous dielectric materials, carbon doped silicate glass dielectric materials and fluorosilicate glass dielectric materials. The first passivation layer 26 may be formed using methods that are appropriate to the material of composition of the first passivation layer 26. Such methods may include, but are not necessarily limited to, spin coating methods, chemical vapor deposition methods and physical vapor deposition methods. Typically, the first passivation layer 26 comprises at least in-part a comparatively low dielectric constant dielectric material that has a thickness from 15 to 100 nanometers.

FIGS. 4/4A/4B/4C show the results of masking the left hand side of the dummy CMOS structure of FIG. 3 with a first mask 28 and selectively etching a portion of the dummy gate 20 from the dummy nFET portion of the dummy CMOS structure to provide a dummy gate 20' and an aperture A1 within the dummy nFET portion of the dummy CMOS structure. The foregoing selective etching of the dummy gate 20 to provide the aperture A1 and a resulting dummy gate 20' while using the first mask 28 as an etch mask may be effected using etch methods and materials that are otherwise generally conventional in the semiconductor fabrication art. Included in particular, but also not limited, are wet chemical etch methods and materials, dry plasma etch methods and materials and combinations of wet chemical etch methods and materials and dry plasma etch methods and materials. Dry plasma etch methods and materials are generally preferred insofar as dry plasma etch methods and materials typically provide a directional etch that yields straight sidewalls to etched features, such as the dummy gate 20'.

Although not specifically illustrated within the schematic perspective-view diagram of FIG. 4 and the schematic cross-sectional diagrams of FIGS. 4A/4C, this particular embodiment also contemplates that the dummy nFET portion of the gate dielectric 18 may also be sequentially stripped after etching the dummy gate 20 to provide the dummy gate 20'.

FIGS. 5/5A/5B/5C first show the results of stripping the first mask 28 from the dummy CMOS structure whose schematic perspective-view diagram is illustrated in FIG. 4, after having etched the dummy gate 20 to form the dummy gate 20'. Such stripping of the first mask 28 may be effected using methods and materials that are otherwise generally conventional in the semiconductor fabrication art. Included in particular, but also not limiting, are wet chemical etch methods, dry plasma etch methods and combinations of wet chemical etch methods and dry plasma etch methods.

FIGS. 5/5A/5C in particular next show the results of forming and planarizing an nFET gate 30 into the aperture A1 left by patterning the dummy gate 20 to form the dummy gate 20' to thus form a dummy pFET and an operative nFET within a partial dummy CMOS (PDCMOS) structure. The nFET gate 30 may comprise any of the several gate conductor materials that are described above within the context of the dummy gate 20. However the gate conductor material that is selected for the nFET gate 30 is typically selected upon an nFET gate 30 work function that optimizes desirable performance of the nFET that is illustrated in FIG. 5A and FIG. 5C. Non-limiting examples of such gate conductor materials for the nFET gate 30 include Zr, W, Ta, Hf, Ti, Al, metal oxide, metal carbide, metal nitride, transition metal aluminides (e.g. Ti$_3$Al, ZrAl), TaC, TaMgC, and any combination of those foregoing gate conductor materials. The foregoing nFET gate 30 conductor material may further comprise a low resistance gate capping layers such as but not limited to TiN, W, Ti, Al, Ta, TaN, Co, and Ni and related non-stoichiometric materials.

In addition, although not specifically illustrated, this particular embodiment contemplates a deposition of a replacement gate dielectric to replace the nFET portion of the gate dielectric 18 when the nFET portion of the gate dielectric 18 is sequentially stripped after etching the dummy gate 20 to form the dummy gate 20'. Such a replacement gate dielectric may be selected from the same group of gate dielectric materials as the gate dielectric 18, but will typically be formed in a U shape lining the aperture A1.

FIGS. 6/6A/6B/6C show the results of masking the right hand side of the partial dummy CMOS structure of FIG. 5 with a second mask 28'. The second mask 28' that is illustrated within the schematic diagrams of FIGS. 6/6A/6C is otherwise analogous, equivalent or identical to the first mask 28 that is illustrated in the schematic diagrams of FIGS. 4/4A/4B, but located and formed upon the right-hand side of the partial dummy CMOS semiconductor structure of FIG. 6, rather than the left-hand side of the dummy CMOS structure of FIG. 4.

FIGS. 6/6A/6B also show the results of patterning of the dummy gate 20' to provide a dummy gate 20" and a resulting aperture A2. This particular patterning of the dummy gate 20' to form the dummy gate 20" and the resulting aperture A2 is otherwise generally analogous, equivalent or identical to the patterning of the dummy gate 20 that is illustrated in FIG. 3 to provide the dummy gate 20' that is illustrated in FIG. 4, along with the resulting aperture A1.

Similarly with the patterning of the dummy gate 20 that is illustrated in FIG. 3 to provide the dummy gate 20' that is illustrated in FIG. 4, the portion of the gate dielectric 18 located at the base of the aperture A2 may also be stripped. Under certain circumstances, this would leave remaining only a portion of the gate dielectric 18 that is designated as gate dielectric 18c aligned beneath the dummy gate 20" that is illustrated in FIG. 6A, since: (1) the portion of the gate dielectric 18 that is designated as gate dielectric 18a may optionally be stripped when etching the dummy gate 20 to form the dummy gate 20'; and (2) the portion of the gate dielectric 18 that is designated as gate dielectric 18b may optionally stripped when etching the dummy gate 20' to form the dummy gate 20".

FIGS. 7/7A/7B/7C first show the results of stripping the second mask 28' from the partial dummy CMOS structure of FIG. 6 to provide a CMOS structure that eventually includes an operational pFET and an operational nFET. The second mask 28' may in particular be stripped from the partial dummy CMOS structure of FIG. 6 to provide in-part the CMOS structure of FIGS. 7/7A/7B/7C while using methods and materials analogous, equivalent or identical to the methods and materials that are used for stripping the first mask 28 from the dummy CMOS structure of FIG. 4 to provide in-part the partial dummy CMOS structure of FIG. 5.

FIGS. 7/7A/7B also show the results of forming and planarizing a pFET gate 32 into the aperture A2 adjacent and adjoining the dummy gate 20''. The pFET gate 32 may be formed using methods and materials analogous, equivalent or identical to the methods and materials used for fabricating the nFET gate 30, but the pFET gate 32 conductor material is typically selected to provide a work function appropriate for optimizing performance of the pFET device within the CMOS structure. Non-limiting examples of the gate conductor materials for the pFET gate 32 include Ru, Pa, Pt, Co, Ni, TiAlN, WCN, metal oxide, metal nitride, $Mo_2N$, MoAlN, and any combination (i.e., including non-stoichiometric combinations) of those materials. Such pFET gate 32 conductor materials may further comprise a low resistance gate capping layer comprising a material such as but not limited to TiN, W, Ti, Al, Ta, TaN, Co, and Ni, and alloys (including non-stoichiometric alloys) thereof.

Similarly, under circumstances where a portion of the gate dielectric 18 is stripped sequentially to etching the dummy gate 20' to form the dummy gate 20'' (i.e., designated as gate dielectric 18b in FIG. 6A), a replacement gate dielectric is first formed into the aperture A2 prior to the pFET gate 32.

Thus, as noted above, within this particular embodiment the gate dielectrics 18 may in fact comprise up to three different dielectric materials, including different dielectric materials beneath each of the pFET gate 32, the dummy gate 20'' and the nFET gate 30, but need not necessarily comprise different dielectric materials. In addition the pFET gate 32 and the nFET gate 30 will typically comprise different gate conductor materials, although such is not necessarily a limitation of this particular embodiment, or of the invention.

FIGS. 8/8A/8B/8C show the results of stripping the dummy gate 20'' from the CMOS structure of FIG. 7 to provide a third aperture A3. The dummy gate 20'' may be stripped from the CMOS structure of FIG. 7 to provide the CMOS structures of FIGS. 8/8A/8B/8C (i.e., including an operational pFET and an operational nFET) while using methods and materials analogous, equivalent or identical to the methods and materials that are used for etching the dummy gate 20 that is illustrated in FIG. 3 to provide the dummy gate 20' that is illustrated in FIG. 4, or the dummy gate 20' that is illustrated in FIG. 5 to provide the dummy gate 20'' that is illustrated in FIG. 6.

As is illustrated within the context of FIGS. 8/8A, upon stripping the dummy gate 20'', the CMOS structure includes remaining the pFET gate 32 and the nFET gate 30 that are co-linear and that have endwalls that terminate facing each other over the isolation region 16. Neither the pFET gate 32 endwall nor the nFET gate 30 endwall has a spacer adjacent or adjoining thereto, but nonetheless the spacer 22 is located adjacent and adjoining the collinear sidewalls of the pFET gate 32 and the nFET gate 30.

Figure 9:
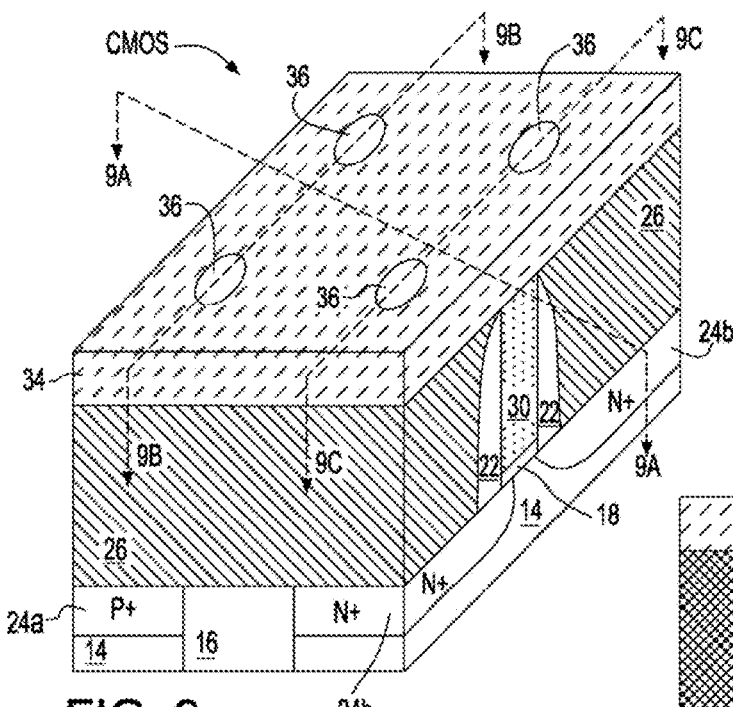
FIGS. 9/9A/9B/9C show the results of a multi-planar T shaped dielectric layer formation process step within the context of the CMOS structure of FIGS. 8/8A/8B/8C.
Figure 9A:
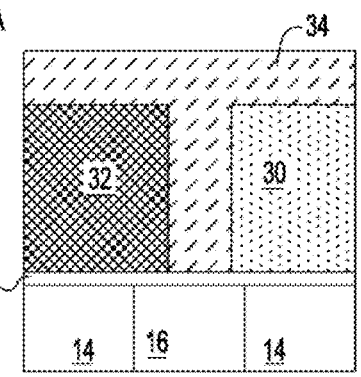
Figure 9B:
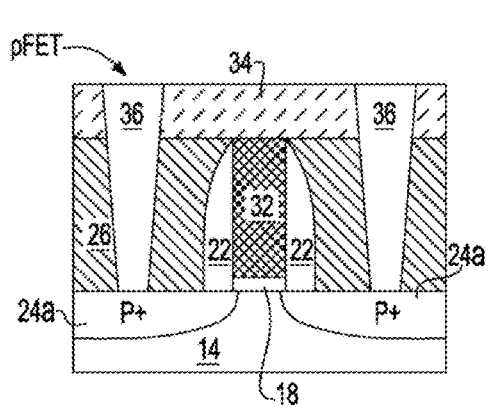
Figure 9C:
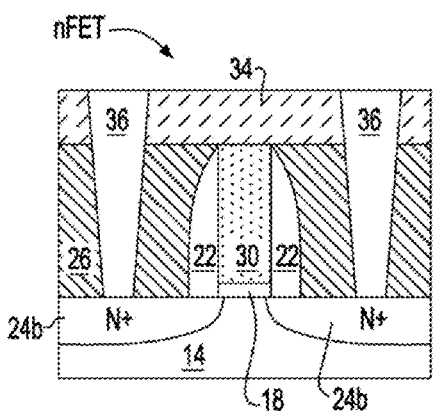

FIGS. 9/9A/9B/9C show a second passivation layer 34 located and formed upon the CMOS structure whose schematic perspective-view diagram is illustrated in FIG. 8. As is illustrated most particularly within the schematic cross-sectional diagram of FIG. 9A, the second passivation layer 34 has a multi-planar "T" shape with respect to vertical planes that bisect by passing through the vertical portion of the T shape.

FIGS. 9/9B/9C further illustrate contact vias 36 that penetrate through the second passivation layer 34 and the first passivation layer 26.

The second passivation layer 34 may comprise materials, have dimensions and be formed using methods analogous, equivalent or identical to the materials, dimensions and methods used for fabricating the first passivation layer 26. The contact vias 36 may comprise conductor contact materials that are similarly also generally conventional in the semiconductor fabrication art. Included in particular, but not necessarily limiting, are tungsten, copper and aluminum conductor contact materials. Typically, but not exclusively, the contact vias 36 are formed using a damascene method.

FIGS. 8/8A/8B/8C and FIGS. 9/9A/9B/9C show a plurality of schematic perspective-view and cross-sectional view diagrams illustrating a CMOS structure including an operational pFET and an operational nFET in accordance with a particular embodiment of the invention. This particular CMOS structure includes a pFET gate 32 that is co-linear with an nFET gate 30. The pFET gate 32 and the nFET gate 30 are located over individual active regions 14 that are separated by an isolation region 16 over which opposite endwalls of the pFET gate 32 and nFET gate 30 terminate. Absent adjacent or adjoining either of the facing endwalls of the pFET gate 32 or the nFET gate 30 is a spacer, although such a spacer 22 is located adjacent and adjoining the sidewalls of the pFET gate 32 and the nFET gate 30. Filling a gap between the pFET gate 32 and the nFET gate 30 is a vertical portion of a multi-planar T shaped second passivation layer 34. In some embodiments, of the present disclosure, a third gate dielectric may be located upon the isolation region and interposed between the first gate dielectric and the second gate dielectric. In such an embodiment, the third gate dielectric can comprise a different gate dielectric material than the first gate dielectric or the second gate dielectric.

Since the pFET gate 32 and the nFET gate 30 are formed using a replacement gate method within the context of the foregoing disclosed embodiment and the invention, the pFET gate 32 and the nFET gate 30 are formed with dimensional uniformity not readily achieved when forming patterned layers of linewidth dimensions less than 30 nanometers and length less than 100 nanometers while using lithographic and etch methods. Moreover, since the pFET gate 32 and the nFET gate 30 are formed using the replacement gate method, the pFET gate 32 and the nFET gate 30 may be electrically isolated and insulated, and independently optimized, without a need of a particular mask dedicated for that purpose (i.e., a dedicated cut mask).

The preferred embodiment is illustrative of the invention rather than limiting of the invention. Modifications and revisions may be made to methods, materials, structures and dimensions for fabricating a CMOS structure in accordance with the preferred embodiment while still providing a CMOS structure and a method for fabrication thereof in accordance with the invention, further in accordance with the accompanying claims.

What is claimed is:
1. A complementary metal oxide semiconductor (CMOS) structure comprising:
    a first FET having a first polarity located upon a first active region of a semiconductor substrate, said first FET including a first gate that is located upon a first gate dielectric portion, said first gate dielectric portion is located only upon an upper horizontal surface of said semiconductor substrate in the first active region;

a second FET having a second polarity different than the first polarity located upon a second active region of the semiconductor substrate separated from the first active region of the semiconductor substrate by an isolation region, said second FET including a second gate that is located upon a second gate dielectric portion, said second gate dielectric portion is located only upon another upper horizontal surface of said semiconductor substrate in the second active region, wherein:

a third gate dielectric portion is located atop the isolation region and is positioned between and in direct contact with the first and the second gate dielectric portions;

the first gate and the second gate are co-linear;

an endwall of the first gate and an endwall of the second gate terminate facing each other over the isolation region and are entirely bare; and a spacer is present adjacent or adjoining a sidewall of the first gate and a sidewall of the second gate.

2. The CMOS structure of claim 1 wherein the semiconductor substrate includes a bulk semiconductor substrate.

3. The CMOS structure of claim 1 wherein the semiconductor substrate includes a semiconductor-on-insulator substrate.

4. The CMOS structure of claim 1 wherein the semiconductor substrate includes a hybrid orientation substrate.

5. The CMOS structure of claim 1 where first polarity is a p polarity and second polarity is an n polarity.

6. The CMOS structure of claim 1 wherein the first gate and the second gate comprise the same gate conductor material.

7. The CMOS structure of claim 1 wherein the first gate and the second gate comprise different gate conductor materials.

8. The CMOS structure of claim 1 wherein the first gate dielectric portion and the second gate dielectric portion comprise the same gate dielectric material.

9. The CMOS structure of claim 1 wherein the first gate dielectric portion and the second gate dielectric portion comprise different gate dielectric materials.

10. The CMOS structure of claim 1 wherein the third gate dielectric portion comprises a different gate dielectric material than the first gate dielectric portion or the second gate dielectric portion.

11. A complementary metal oxide semiconductor (CMOS) structure comprising:

a first FET having a first polarity located upon a first active region of a semiconductor substrate, said first FET including a first gate that is located upon a first gate dielectric portion, said first gate dielectric portion is located only upon an upper horizontal surface of said semiconductor substrate in the first active region;

a second FET having a second polarity different than the first polarity located upon a second active region of the semiconductor substrate separated from the first active region of the semiconductor substrate by an isolation region, said second FET including a second gate that is located upon a second gate dielectric portion, said second gate dielectric portion is located only upon another upper horizontal surface of said semiconductor substrate in the second active region, wherein:

a third gate dielectric portion is located atop the isolation region and is positioned between and in direct contact with the first and second gate dielectric portions;

the first gate and the second gate are co-linear;

an endwall of the first gate and an endwall of the second gate terminate facing each other over the isolation region and are separated by a gap, absent a spacer adjacent or adjoining the facing endwall of the first gate or the facing endwall of the second gate, but including a spacer adjacent or adjoining a sidewall of the first gate and a sidewall of the second gate; and a multi-planar T shaped dielectric material passivation layer passivating the first FET and the second FET, and filling the gap.

12. The CMOS structure of claim 1 where the first polarity is an n polarity and the second polarity is a p polarity.

* * * * *